United States Patent
Yoshii et al.

(10) Patent No.: US 6,792,674 B2
(45) Date of Patent: Sep. 21, 2004

(54) APPARATUS FOR MOUNTING ELECTRONIC COMPONENTS

(75) Inventors: Takashi Yoshii, Ota (JP); Hideaki Fukushima, Oizumi-machi (JP); Akihiro Kawai, Isesaki (JP)

(73) Assignee: Hitachi High-Tech Instruments Company, Ltd., Gunma (JP)

( * ) Notice: Subject to any disclaimer, the term of this patent is extended or adjusted under 35 U.S.C. 154(b) by 85 days.

(21) Appl. No.: 09/968,717

(22) Filed: Oct. 2, 2001

(65) Prior Publication Data

US 2002/0092161 A1 Jul. 18, 2002

Related U.S. Application Data

(63) Continuation-in-part of application No. 09/843,154, filed on Apr. 26, 2001, now abandoned.

(30) Foreign Application Priority Data

Apr. 28, 2000 (JP) ........................................ 2000-130243

(51) Int. Cl.[7] .............................................. B23P 19/00
(52) U.S. Cl. ............................ 29/740; 29/705; 29/832; 29/833; 29/840; 356/237.1; 356/237.5
(58) Field of Search ........................ 29/705, 833, 832, 29/825, 840, 740; 356/375, 237.1, 237.5, 237

(56) References Cited

U.S. PATENT DOCUMENTS

| 4,312,109 A | | 1/1982 | Kawana et al. |
| 4,738,025 A | * | 4/1988 | Arnold |
| 4,959,898 A | * | 10/1990 | Landman et al. |
| 5,084,962 A | * | 2/1992 | Takahashi et al. |
| 5,224,262 A | | 7/1993 | Takaichi et al. |
| 5,249,239 A | * | 9/1993 | Kida |
| 5,383,270 A | * | 1/1995 | Iwatsuka et al. |
| 5,440,391 A | * | 8/1995 | Smeyers et al. |
| 5,452,080 A | * | 9/1995 | Tomiya |
| 5,563,703 A | * | 10/1996 | Lebeau et al. |
| 5,854,745 A | * | 12/1998 | Muraoka et al. |
| 5,956,134 A | * | 9/1999 | Roy et al. |
| 5,992,013 A | * | 11/1999 | Morita |
| 6,094,808 A | | 8/2000 | Mimura et al. |
| 6,243,164 B1 | * | 6/2001 | Baldwin et al. |

FOREIGN PATENT DOCUMENTS

| EP | 0 395 002 | 10/1990 |
| EP | 0 835 050 | 4/1998 |
| EP | 0 895 450 | 2/1999 |
| EP | 0 904 678 | 3/1999 |
| EP | 1 018 862 | 7/2000 |
| EP | 1 032 251 | 8/2000 |
| JP | 08-078893 | 3/1996 |

* cited by examiner

Primary Examiner—Carl J. Arbes
(74) Attorney, Agent, or Firm—Morrison & Foerster LLP

(57) ABSTRACT

A recognition camera images an electronic component, and a recognition processing unit performs recognition processing of the electronic component based on the result of the imaging. The recognition processing is performed using the component data of group 1 data, group 2 data, group 3 data, and group 4 data that are stored for the images taken in a random access memory (RAM). The group 1 data is used for lead inspection (for inspecting positioning error and bending of the lead), the group 2 data and the group 3 data are used for calculating amounts of adjustment in the X and Y directions, and the group 4 data is used for calculating the amount of adjustment in the θ direction. This makes it possible to mount accurately components with pins and extrusions extruded from the molding, such as connectors, such that the pins and extrusions are accurately engaged with the holes formed in a print board.

8 Claims, 7 Drawing Sheets

FIG.3

| [ mounting data ] | | | | |
|---|---|---|---|---|
| step number | X | Y | θ | positioning number |
| 1 | X1 | Y1 | θ1 | R1 |
| ⋮ | ⋮ | ⋮ | ⋮ | ⋮ |
| n | Xn | Yn | θn | Rn |

FIG.4

| [ component positioning data ] | |
|---|---|
| positioning data | component ID |
| R1 | P1 |
| ⋮ | ⋮ |
| Rn | Pn |

FIG.5

| [ component data ] | |
|---|---|
| component ID | component data |
| P1 | reference Fig.8 |
| ⋮ | ⋮ |
| Pn | reference Fig.11 |

APPARATUS FOR MOUNTING ELECTRONIC COMPONENTS

This application is a continuation-in-part of Ser. No. 09/843,154, filed Apr. 26, 2001, now abandoned.

FIELD OF THE INVENTION

This invention relates to an electronic component mounting apparatus that mounts an electronic component on a print board after a recognition processing unit performs recognition processing based on the result of imaging of the electronic component performed by a recognition camera.

BACKGROUND OF THE INVENTION

Such an electronic component mounting apparatus is generally disclosed in Japanese Laid Open Patent Publication No. Hei 8-78893. The prior art usually positions components with leads such as connectors by performing recognition processing of the lead (electrode or ball) or molding only. In this case, pre-registered information on the lead and molding is all that is used for the recognition processing, and the position and the angle of the electronic component are calculated based on the result of the recognition processing.

However, when the position of a component with a lead such as a connector is determined based only on the position recognition of the tip of lead, an accurate angle relative to the molding could not be obtained due to the poor accuracy of the electronic component itself. Thus, in some cases, the pins and extrusions extending from the molding are not accurately engaged with the holes formed in a print board.

SUMMARY OF THE INVENTION

Therefore, a feature of this invention is to accurately mount components with pins and extrusions extending from the molding, such as connectors, such that the pins and extrusions are accurately engaged with the holes formed in a print board.

The invention provides an electronic component mounting apparatus having a recognition camera for imaging an electronic component and a recognition processing unit for performing recognition processing based on the results of the imaging, so that the electronic component can be mounted on a print board. The apparatus includes a memory which stores information regarding a use of the result of the recognition processing performed by the recognition processing unit and a control unit which derives the information regarding the use of the result of the recognition processing, wherein the recognition processing performed by the recognition processing unit is performed on different locations of the electronic component and the information regarding the use of the result of the recognition processing is stored in the memory for each of the locations. The invention also provides a method for mounting an electronic component on a print board comprising the steps of imaging of the electronic component, performing a recognition processing based on results of the imaging for a first and a second group of locations, deriving information regarding a use of the results of the recognition processing, and placing the electronic component.

In this invention, the use involves calculating the amount of positioning adjustment of the electronic component or dimensional inspection of lead bending, for example.

BRIEF DESCRIPTION OF THE DRAWINGS

FIG. 3 shows a set of mounting data.

FIG. 4 shows a set of component positioning data.

FIG. 5 shows a set of component data.

DETAILED DESCRIPTION OF THE INVENTION

Figure 1:
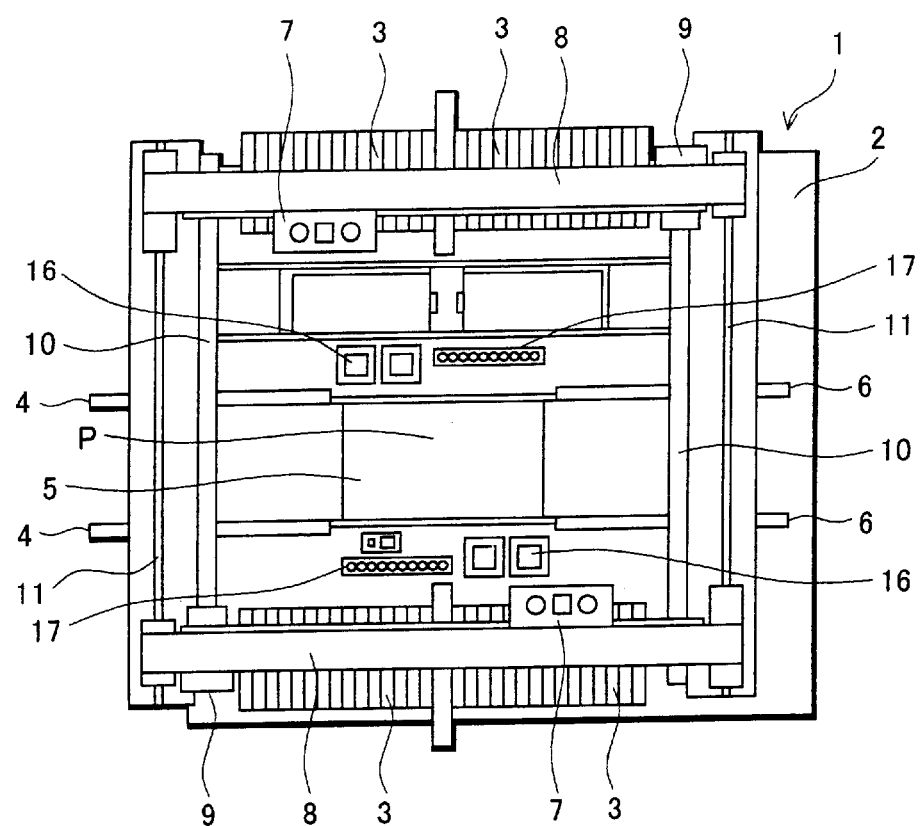
FIG. 1 is a plan view of an electronic component mounting apparatus according to this invention.

An illustrative, non-limitting embodiment of the electronic component mounting apparatus based on this invention will be described in detail referring to the drawings hereinafter.

FIG. 1 is a plan view of an electronic component mounting apparatus 1. On a base 2 of the apparatus 1, a plurality of component feeding units 3 that feed one component of various kinds of electronic components at a time to each component pick-up portion (component suction position) is juxtaposed. Between the groups of the unit 3 facing each other, feeding conveyers 4, a positioning portion 5 and exhausting conveyers 6 are mounted. The feeding conveyer 4 receives the print board P from upper stream and sends the print board to the positioning portion 5. After an electronic component is mounted on the print board P positioned by a positioning mechanism, not shown in the figure, of the positioning portion 5, the print board P is sent to the exhausting conveyer 6.

Reference numeral 8 is a pair of beams that extends in the X direction and moves the print board P or the upper part of the component pick-up portion (component suction position) of the feeding unit 3 individually in the Y direction along with a pair of the parallel guides 11 by rotating the screw axis 10 by the drive of Y axis motor 9.

A mounting head 7 that moves in the X direction, which is the longitudinal direction, along the guide (not shown in the figure) by the drive of an X axis motor 12 is mounted on each beam 8. On each mounting head 7, two vertical axis motors 14 that move two suction nozzles (not shown in the figure) in vertical direction and two θ axis motors for rotating the suction nozzles around vertical axis are mounted. Therefore, it is possible for each of the two suction nozzles on the mounting head to move in X and Y directions, to rotate around vertical axis, and to move upwards and downwards. Also, by mounting one θ axis motor that makes mounting head rotate around vertical axis and one vertical axis motor that moves mounting head upwards and downwards, it is possible to move only the selected suction nozzles upwards and downwards.

Reference numeral 16 is a recognition camera for recognizing component position. Each of the mounting heads 7 has two cameras 16, and there are four cameras in total. The cameras perform the imaging of an electronic component for recognizing the amount of positioning error of the electronic component relative to the suction nozzle in X and Y direction, and rotation angle. Each camera can perform imaging of two electronic components simultaneously. Reference numeral 17 is a stocker for stocking nozzles.

Although the stocker can store up to ten nozzles, it stores nine nozzles in this embodiment.

Figure 2:
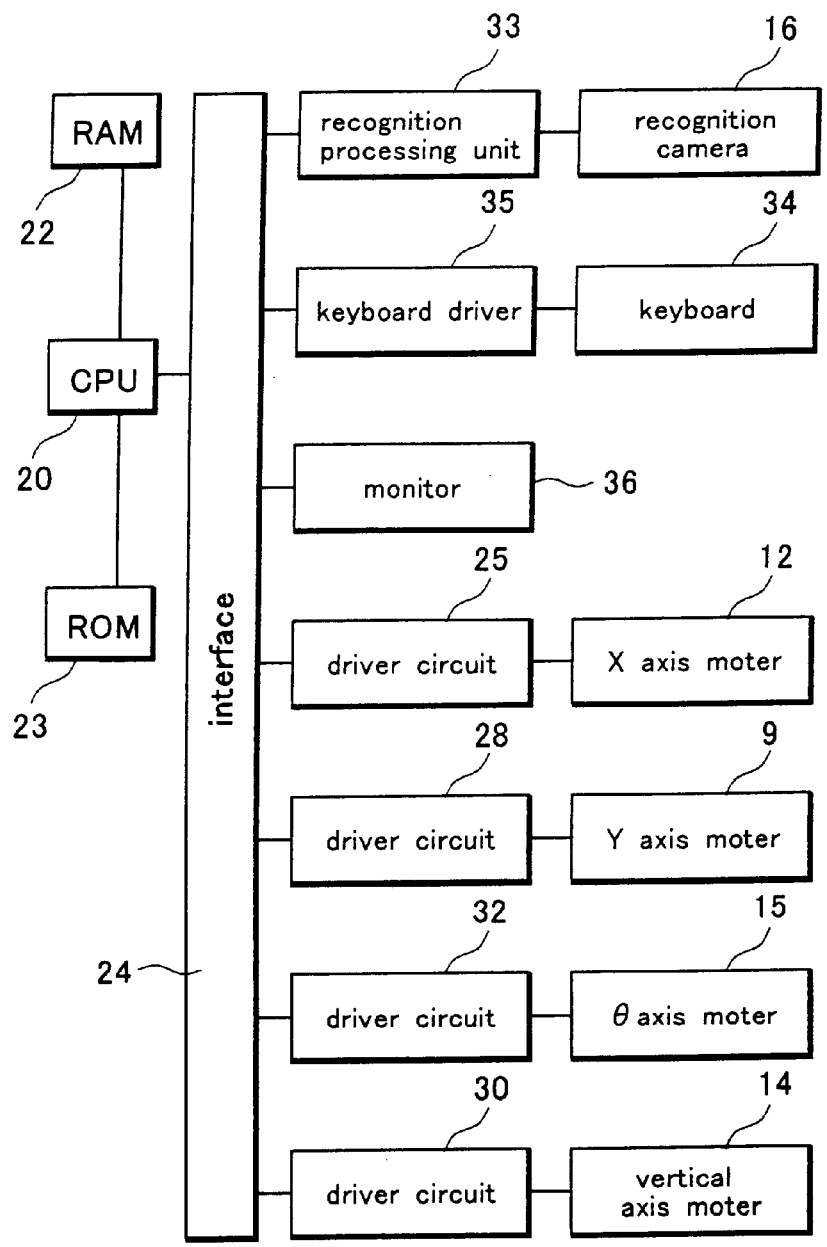
FIG. 2 is a block diagram for controlling an electronic component mounting apparatus.

FIG. 2 is a block diagram for controlling the electronic component mounting apparatus. One each of X axis motors 12, Y axis motors 9, θ axis motors 15 and vertical axis motors 14 are shown in the figure as a matter of convenience.

Reference numeral 20 is a CPU (mounting controlling unit) as a controlling unit that controls the mounting apparatus 1. To the CPU 20, RAM (random access memory) 22 and ROM (read only memory) 23 are connected through bus-line. CPU 20 controls the movements related to the component mounting procedure of electronic component mounting apparatus 1 based on the data stored in a rewritable manner in the RAM 22 and in accordance with the program stored in the ROM 23. The RAM 22 can be a separate component or integrated as a set of registers into the CPU 20.

That is, CPU 20 controls the movements of the X axis motor 12 through interface 24 and driver circuit 25, the movements of the Y axis motor 9 through interface 24 and driver circuit 28, the movements of the θ axis motor 15 through interface 24 and driver circuit 32, and the movements of the vertical axis motor 14 through interface 24 and driver circuit 30.

Mounting data related to component mounting as shown in FIG. 3 is stored in the RAM 22. For each step of the mounting (at each step number), the information on X direction (indicated by X), Y direction (indicated by Y) and angle (indicated by θ) in a print board and the information on positioning number of each component feeding unit 3 are stored. In the RAM 22, the component positioning data, as shown in FIG. 4, are stored. Here, the type of each component (component ID) corresponding to the positioning number of the component feeding unit 3 is stored. Also, in the RAM 22, the component data (parts library data) for component recognition that identify characteristics of each component, as shown in FIG. 5, is stored. This will be explained in detail later.

Reference numeral 33 is a recognition processing unit connected to the CPU 20 through interface 24 and the recognition processing of the images taken by the recognition camera 16 is performed based on the parts library data at the recognition processing unit 33, and then the result of the processing is sent to CPU 20. That is, CPU 20 outputs the direction to the recognition processing unit 33 to perform recognition processing (to calculate the amount of adjustment) on the image taken by the recognition camera 16, and receives the result of the recognition processing from the recognition processing unit 33.

Reference numeral 34 is a keyboard as a data registering device connected to the CPU 20 through keyboard driver 35 and interface 24, and reference numeral 36 is a monitor that displays the images of components. The keyboard 34 is for inputting the characteristics of electronic components based on format screen. Also, in the RAM 22, a plurality of format for constructing parts library data is stored. As the data registering means, other means such as touch panel can be used in place of the keyboard 34.

Figure 6:
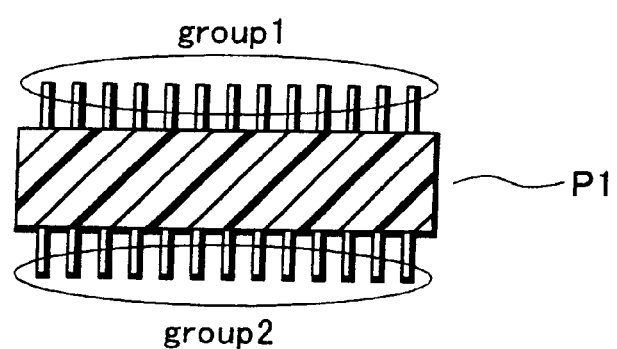
FIG. 6 is a plan view of component P1.
Figure 7:
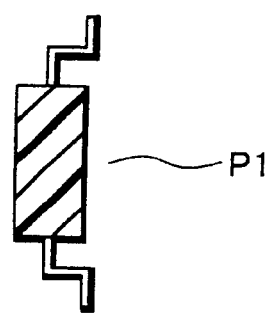
FIG. 7 is a side view of component P1, being looked from the right.
Figure 8:
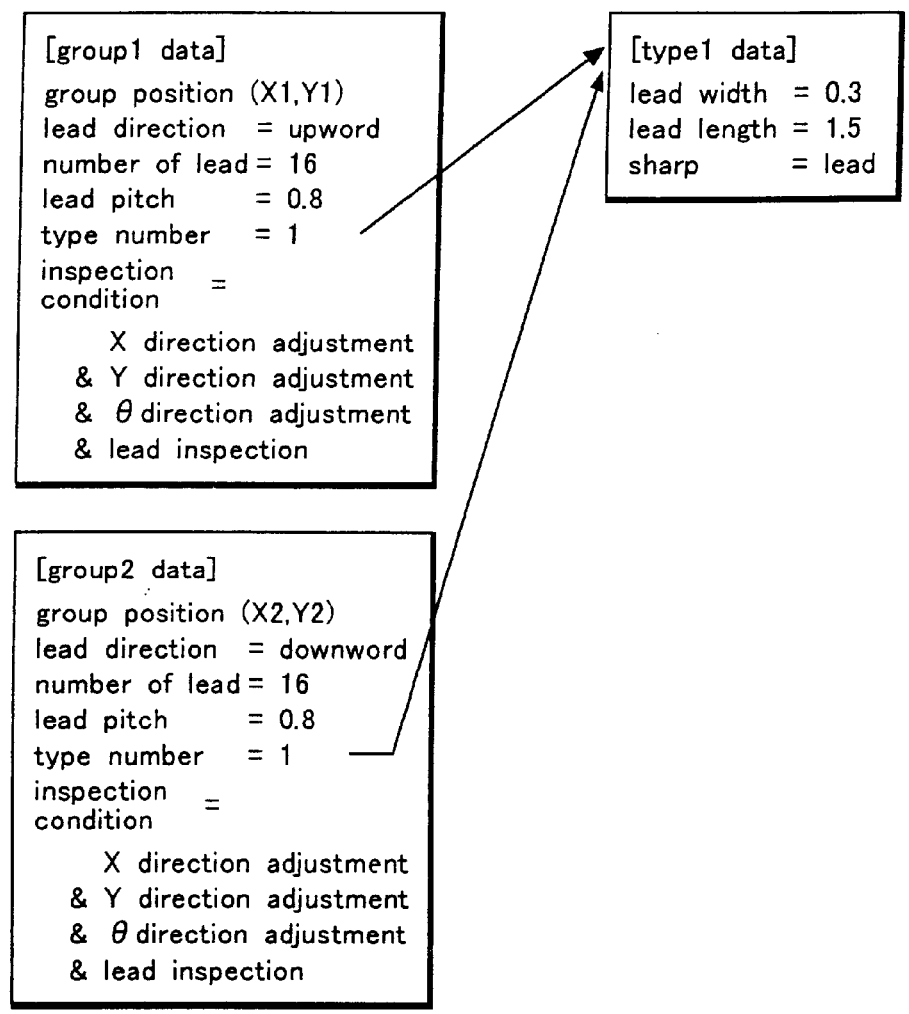
FIG. 8 shows a set of component data of component P1.

Next, the operation for registering component data used as component recognition data by using the electronic component mounting apparatus 1 as a data constructing apparatus of electronic component is explained. The electronic component with component ID of P1 has such a shape as shown in FIGS. 6 and 7, and has a flat bottom. As to this component, the positions where the recognition processing by the recognition processing unit 33 is performed are devided into two groups. Group 1 data of the component data shown in FIG. 8 comprises X coordinate from the central position of the electrical component itself to the central position of group 1 in X direction, Y coordinate from the central position of the electronic component to the position of the tip of group 1 in Y direction, lead direction (upwards), the number of leads (16), lead pitch (0.8), and inspection condition, and is inputted by using the keyboard 34 and monitor 36, and stored in RAM 22. Group 2 data is also constructed in the same manner. Each of the type number 1 represents type 1 data where lead width (0.3), lead length (1.5) and shape (lead) are inputted in such a manner, and stored in RAM 22.

Then, the inspection condition of each group, that is, the information regarding the use of the recognition result of each group is rewritably stored in RAM 22. As to the electronic component, this use of the result of the recognition processing is used for calculating the amount of adjustment in X, Y, and θ directions and for lead inspection (for inspecting positioning error and bending of the lead).

Figure 9:
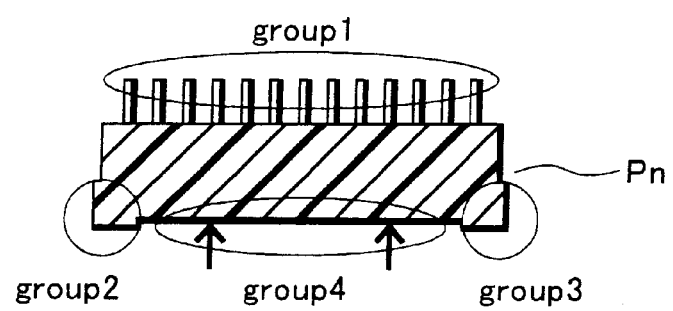
FIG. 9 is a plan view of component Pn.
Figure 10:
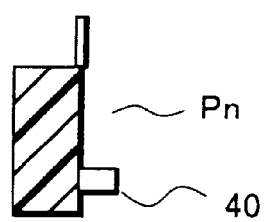
FIG. 10 is a side view of component Pn, being looked from the right.
Figure 11:
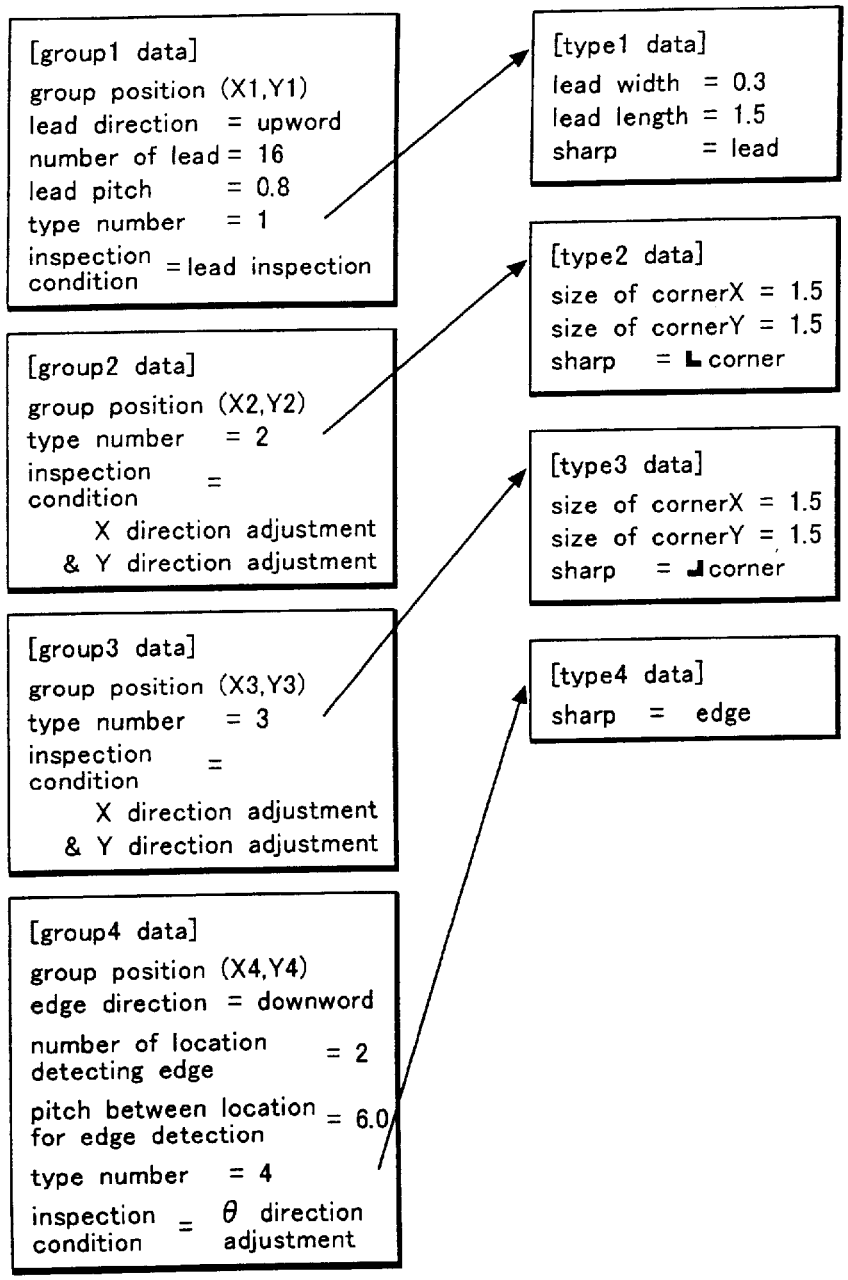
FIG. 11 shows a set of component data of component Pn.

The electronic component with component ID of Pn, such as a connector, has the shape shown in FIGS. 9 and 10, and has, for example, two pins and extrusions 40 to be inserted to a print board P on the bottom of the molding. As to this component, the locations for the recognition processing by the recognition processing unit 33 are devided into four groups that are described by circles and ovals in FIG. 9. Group 1 data of the component data shown in FIG. 11 comprises X coordinate from the central position of the electrical component itself to the central position of group 1 in X direction, Y coordinate from the central position of the electronic component to the position of the tip of group 1 in Y direction, lead direction (upwards), number of leads (16), lead pitch (0.8), and inspection condition, and is inputted by using the keyboard 34 and monitor 36, and stored in RAM 22. Group 2 data, group 3 data, and group 4 data are also constructed in the same manner. The group 4 comprises X coordinate from the central position of the electronic component itself (the molding) to the edge of the molding, which is the location for inspection (indicated by an arrow in FIG. 9) in X direction, Y coordinate from the central position of the electronic component itself to the edge of the molding, which is the locations for inspection in Y direction, the direction of the edge (downwards, that is, from black molding to white background in an image), the number of the locations on the edge for inspection (two), the pitch between the locations on the edge for inspection (0.6), and inspection condition, and is inputted by using keyboard 34 and monitor 36 and stored in RAM 22. Type number 1 represents type 1 data comprising lead width (0.3), lead length (1.5) and shape (lead), type number 2 represents type 2 data comprising the size of corner X (1.5), the size of corner Y (1.5) and shape, type number 3 represents type 3 data comprising the size of corner X (1.5), the size of corner Y (1.5) and shape, and type number 4 represents type 4 data comprising shape (edge). All these information are stored in RAM 22.

As to the electric component, the group 1 data is used for lead inspection (for inspecting positioning error and bending of the lead), the group 2 and the group 3 data are used for calculating the amounts of adjustment in X and Y directions, and the group 4 data is used for calculating the amount of adjustment in θ direction.

Next, manufacturing operation of the electronic component mounting apparatus is explained.

The mounting head 7 takes the electronic component P1 from the component feeding unit 3 and then carries it to the recognition camera 16. Next, the recognition camera 16 performs imaging of the electronic component P1, and the recognition processing unit 33 performs the recognition processing based on the images taken for detecting the positioning error of the electronic component P1 relative to the suction nozzle. The recognition processing operation is explained in detail hereinafter.

Based on the group 1 data, the group 2 data, and the component data of type 1 data stored in RAM 22 on the images taken, group position, lead direction, number of the lead, lead pitch, lead length are recognized by the recognition processing unit 33.

The result of the recognition is used for calculating the amounts of adjustment in X, Y, and θ and also used for lead inspection (for inspecting positioning error and bending of the lead). Based on the recognition result of the recognition processing unit 33, CPU 20 moves the beam 8 by the drive of Y axis motor 9 and the mounting head by the drive of X axis motor 12, and rotates the mounting head by the drive of the θ axis motor by the amount of positioning error for making the adjustment of the nozzle position in X and Y directions and in rotating angle around vertical axis. After the adjustment, the vertical axis motor 14 starts driving to move the suction nozzle downwards and the electronic component is mounted on the right position in a print board.

When the recognition processing unit 33 recognizes an error (electronic component should not be mounted), the information is sent to CPU 20 and the electric component is discarded. The error is recognized, for example, when bending of the lead is beyond a tolerance, then the discarding processing is performed. In some cases, the defective electronic components are not discarded, but transported to a storage location, such as a box, through a transportation mechanism, such as a conveyer. The defective electronic components may also be transferred to the storage box by the mounting head 7. These electronic components are repaired and used in other mounting processes.

The recognition camera 16 performs the imaging of the electronic component Pn, and the recognition processing of the electronic component Pn is performed by the recognition processing unit 33. The recognition processing is explained next. Based on the group 1 data and the component data of type 1 data stored in RAM 22 for the images taken, group position, lead direction, number of the lead, lead pitch, lead length are processed by the recognition processing unit 33. In the same manner, based on the component data of the group 2 data, the group 3 data, the type 2 data, and the type 3 data, group position, sizes of comers X and Y and shape are processed, and based on the component data of the group 4 data and the type 4 data, group position, edge direction, the number of the locations detecting edges, the pitch between the locations for edge detection, and shape are processed respectively.

The group 1 data is used for lead inspection (for inspecting positioning error and bending of the lead), the group 2 data and the group 3 data are used for calculating the amounts of adjustment in X and Y directions, and the group 4 data is used for calculating the amount of adjustment in the θ direction. Then, the mounting processing or the discarding processing is performed as described above. In this embodiment, since the group 4 data is used for calculating the amount of adjustment in the θ direction, it is possible to mount accurately components with pins and extrusions extruded from the molding, such as connectors, such that the pins and extrusions are accurately engaged with the holes formed in a print board.

Also, the locations of the recognition processing of the recognition processing unit 33 are devided into groups and the information regarding the use of the recognition result of each group is rewritably stored in RAM 22. And CPU 20 derives the use of the result of recognition processing by the recognition processing unit 33 based on the contents stored in the RAM 22. The result of the recognition of lead edge can also be used for calculating the amount of adjustment in the θ direction.

As explained above, the electronic component mounting apparatus of this invention can accurately mount electric component on a print board. In prior arts, since the position of the component with lead such as connector is determined based only on the position recognition of the tip of lead, an accurate angle relative to molding could not be obtained due to the poor accuracy of the electronic component itself, and thus the pins and extrusion extruded from the molding are not accurately engaged with the holes formed in a print board. This invention, when applied to the component with lead such as connector, can mount accurately components with pins and extrusions extruded from the molding, such that the pins and extrusions are accurately engaged with the holes formed in a print board.

What is claimed is:

1. An electronic component mounting apparatus comprising:
    a recognition camera for imaging an electronic component;
    a recognition processing unit for performing recognition processing based on results of the imaging;
    a memory which stores information regarding a use of the result of the recognition; and
    a control unit which derives the information regarding the use of the result of the recognition processing based on data stored in the memory;
    wherein locations of the recognition processing by the recognition processing unit are divided into groups and the memory stores the information regarding the use of the result of the recognition for each group, at least one of the uses of the result of the recognition being different from another of the uses of the result of the recognition.

2. The electronic component mounting apparatus according to claim 1, wherein the use is calculating the amount of positioning adjustment of the electronic component or dimensional inspection of lead bending.

3. The electronic component mounting apparatus according to claim 2, wherein the recognition processing is performed on a location for lead inspection and a location for molding inspection when an electronic component comprising a molding and leads is inspected.

4. The electronic component mounting apparatus according to claim 1 or 2, wherein the recognition processing is separately performed on a location for lead inspection, a location for X and Y direction recognition, and a location for θ direction recognition when an electronic component with leads is recognized.

5. The electronic component mounting apparatus according to claim 4, wherein the memory stores the information regarding the use rewritably.

6. The electronic component mounting apparatus according to claim 5, wherein the control unit is designed to calculate amounts of adjustment for linear or angular positioning errors.

7. The electronic component mounting apparatus according to claim 1, further comprising a mounting head, wherein the recognition camera is configured to image the electronic component while the mounting head holds the electronic component.

8. An electronic component mounting apparatus comprising:

a mounting head for holding an electronic component;

a recognition camera taking an image of the electronic component while the mounting head holds the electronic component;

a memory storing a first set of data and a second set of data, the first set of data corresponding to a first type of examination of one location of the electronic component, and the second set of data corresponding to a second type of examination of another location of the electronic component, and a computation unit which performs the first type of examination by comparing the first set of data to data derived from a first portion of the image taken by the recognition camera, the first portion corresponding to said one location of the electronic component, and performs the second type of examination by comparing the second set of data to data derived from a second portion of the image taken by the recognition camera, the second portion corresponding to said another location of the electronic component.

* * * * *